United States Patent
Miyagawa et al.

(10) Patent No.: US 12,209,853 B2
(45) Date of Patent: Jan. 28, 2025

(54) NON-CONTACT APPARATUS FOR MEASURING WAFER THICKNESS

(71) Applicant: Fujikoshi Machinery Corp., Nagano (JP)

(72) Inventors: Chihiro Miyagawa, Nagano (JP); Kazutaka Shibuya, Nagano (JP); Kiyohito Aoki, Nagano (JP)

(73) Assignee: Fujikoshi Machinery Corp., Nagano (JP)

(*) Notice: Subject to any disclaimer, the term of this patent is extended or adjusted under 35 U.S.C. 154(b) by 359 days.

(21) Appl. No.: 17/604,553

(22) PCT Filed: Apr. 9, 2020

(86) PCT No.: PCT/JP2020/015908
§ 371 (c)(1),
(2) Date: Oct. 18, 2021

(87) PCT Pub. No.: WO2020/230489
PCT Pub. Date: Nov. 19, 2020

(65) Prior Publication Data
US 2022/0196390 A1 Jun. 23, 2022

(30) Foreign Application Priority Data
May 15, 2019 (JP) ................................ 2019-092223

(51) Int. Cl.
*G01B 11/06* (2006.01)
*G01N 21/95* (2006.01)
(Continued)

(52) U.S. Cl.
CPC ..... *G01B 11/0675* (2013.01); *G01N 21/9501* (2013.01); *H01L 21/304* (2013.01); *H01L 22/12* (2013.01)

(58) Field of Classification Search
CPC . G01B 11/0675; G01B 11/06; G01B 11/0691; G01B 9/02004; G01B 9/02007;
(Continued)

(56) References Cited

U.S. PATENT DOCUMENTS 9,279,742 B1 * 3/2016 Minneman ........... G01M 11/331
9,403,257 B2   8/2016 Miura et al.
(Continued)

FOREIGN PATENT DOCUMENTS

| JP | A-7-306018 | 11/1995 |
| JP | 2002-323303 | 11/2002 |
| JP | A-2006-80384 | 3/2006 |

OTHER PUBLICATIONS

International Search Report for PCT/JP2020/015908 dated Jun. 23, 2020.
(Continued)

*Primary Examiner* — Tarifur R Chowdhury
*Assistant Examiner* — Carlos Perez-Guzman
(74) *Attorney, Agent, or Firm* — Stephen J. Weyer, Esq.; Stites & Harbison, PLLC

(57) ABSTRACT

A non-contact apparatus for measuring wafer thickness includes a monolithic wavelength sweeping semiconductor laser light source having a laser source, a laser control unit that controls the laser source, and a processor to control the laser source to oscillate laser light having a wavelength that changes with a setting profile relative to time; an optical system that guides and emits the laser light onto a wafer; a detection unit that detects an interference light signal of reflected light; an A/D converter that converts the interference light signal detected by the detection unit into a digital signal; and a calculation unit that calculates a thickness of the wafer by analyzing the digital signal from the A/D converter. The processor causes the laser control unit to
(Continued)

operate with a clock signal, and to oscillate laser light that performs wavelength-sweeping with the setting profile relative to the time, from the laser source. The A/D converts the interference light signal by generating a sampling clock in synchronization with the clock signal or directly using the clock signal as a sampling clock.

9 Claims, 6 Drawing Sheets

(51) Int. Cl.
*H01L 21/304* (2006.01)
*H01L 21/66* (2006.01)

(58) Field of Classification Search
CPC .............. G01B 9/0201; G01B 9/02014; G01N 21/9501; H01L 21/304; H01L 22/12; B24B 37/08; B24B 37/10; B24B 49/12
See application file for complete search history.

(56) References Cited

U.S. PATENT DOCUMENTS

| | | |
|---|---|---|
| 9,595,804 B2 | 3/2017 | Minneman et al. |
| 10,530,119 B2 | 1/2020 | Takabayashi et al. |
| 11,054,246 B2 * | 7/2021 | Kimura .............. G01B 11/0608 |
| 2011/0299097 A1 * | 12/2011 | Ohtsuka ............... G01B 11/0633 356/630 |
| 2012/0089365 A1 * | 4/2012 | Fay ....................... G01B 9/0209 703/2 |
| 2014/0307753 A1 | 10/2014 | Minneman et al. |
| 2015/0065010 A1 | 3/2015 | Miura et al. |
| 2015/0109621 A1 * | 4/2015 | Huber ................ G01B 9/02043 356/479 |
| 2015/0255951 A1 * | 9/2015 | Kato ................... H01S 5/06821 356/508 |
| 2015/0371908 A1 * | 12/2015 | Bencher ............. H01L 21/2686 438/4 |
| 2016/0334205 A1 * | 11/2016 | Aiyer ................. G01B 11/0675 |
| 2018/0256031 A1 * | 9/2018 | Adamson ........... G01B 9/02091 |
| 2019/0044300 A1 | 2/2019 | Takabayashi et al. |
| 2020/0011654 A1 * | 1/2020 | Safrani .................. G01B 11/06 |

OTHER PUBLICATIONS

Written Submission of Publications from Japanese Patent Office.
Behroozpour, et al., "Chip-Scale Electro-Optical 3D FMCW Lidar with 8um Ranging Precision", 2016, pp. 214-216, IEEE International Solid-State Circuits Conference.

* cited by examiner

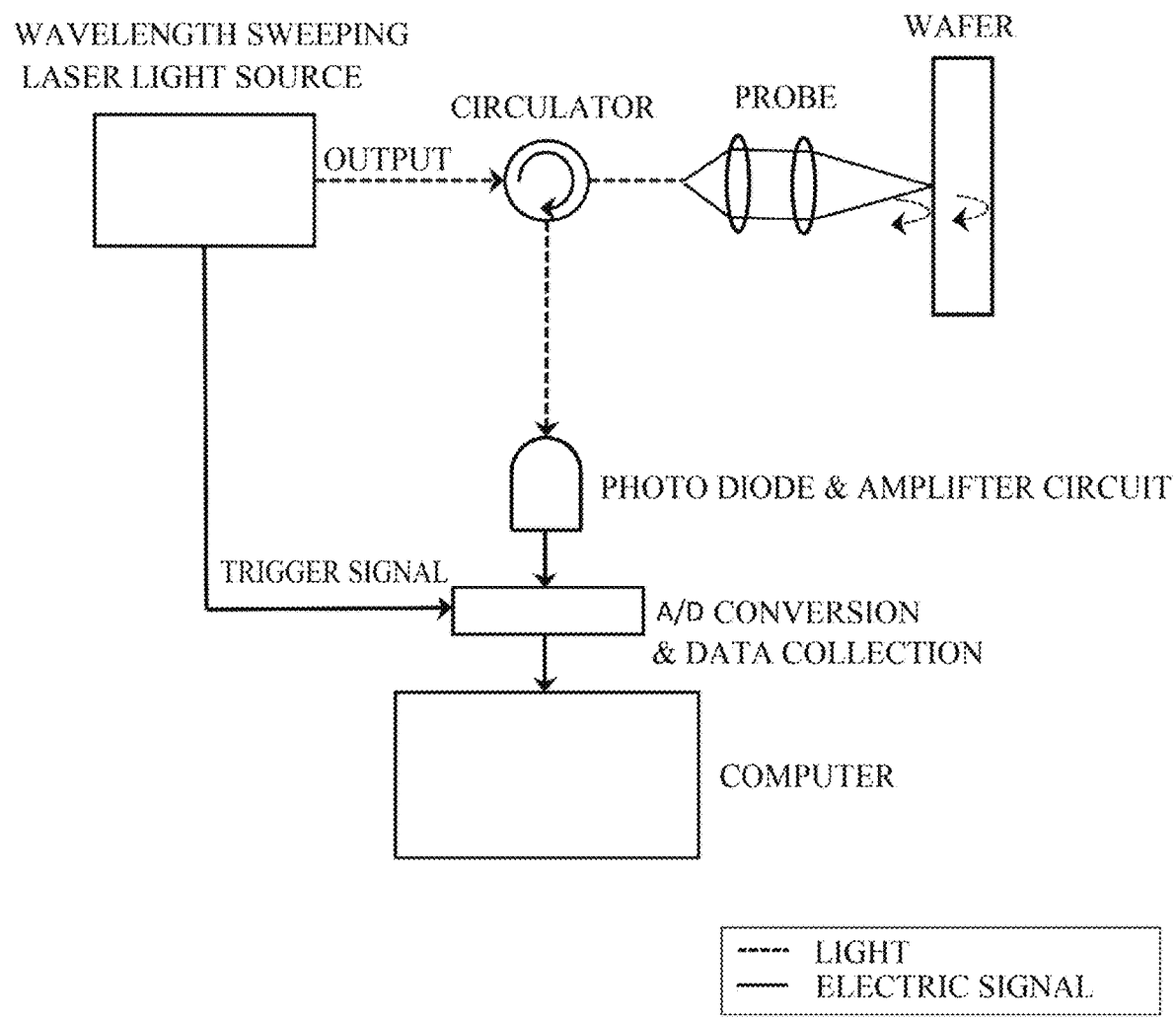

NON-CONTACT APPARATUS FOR MEASURING WAFER THICKNESS

TECHNICAL FIELD

The present invention relates to a non-contact apparatus for measuring wafer thickness using a monolithic wavelength sweeping semiconductor laser light source.

BACKGROUND ART

In polishing devices for a semiconductor wafer such as silicon, double-sided polishing or single-sided polishing on the wafer is performed to process the wafer into a required thickness.

The semiconductor wafer is used for semiconductor mechanism elements having a high integration degree, and the thickness measurement with higher accuracy is required during a processing process or in a middle of the process because the integration degree becomes higher and an effort of improving the productivity is performed.

PTL 1 (JP-A-7-306018) discloses a device for non-contact measurement of thickness of a semiconductor using a wavelength variable laser.

In the device for non-contact measurement of thickness of a semiconductor indicated in PTL 1, when a light beam passing through a semiconductor is emitted onto a target region on a semiconductor to be measured, a part of the light that has interfered by being reflected on a front surface and a bottom surface is reflected on or passed through the semiconductor. The reflected or passed interference light is guided to a detector by an optical unit to vary the wavelength of light beams in a prescribed range. At that time, because a phase (or cycle) of the interference light intensity changes depending on the thickness of the semiconductor, an absolute value of the thickness of the semiconductor is converted by the calculation from the intensity change of the interference light.

As for the abovementioned wavelength variable laser, for example, a wavelength sweeping-type laser light source indicated in PTL 2 (JP-A-2006-80384) is used. Alternatively, a wavelength sweeping-type laser light source as illustrated in FIG. 6 is used.

CITATION LIST

Patent Literature

PTL 1: JP-A-7-306018
PTL 2: JP-A-2006-80384

SUMMARY OF INVENTION

Technical Problem

However, in the wavelength sweeping-type laser light source indicated in PTL 2, a mechanical operation unit such as a polygon mirror is used in order to obtain a sweep wavelength. The use of the mechanical operation unit such as the polygon mirror causes a slight shift in reflected light due to a slight distortion on a mirror surface of the mirror, which causes such a problem that a wavelength to be swept slightly shifts. Moreover, the mechanical operation unit is present to generate slight mechanical vibration, which results in the shift of the wavelength to be swept. Accordingly, even when an interference signal of light is acquired in order to measure the thickness in the same location, and is converted into a digital signal, and the digital signal is subjected to signal processing by high-speed Fourier transform, the center frequency thereof is shifted, which results in the generation of an accidental error in the thickness.

Solution to Problem

The present invention has been accomplished in order to solve the abovementioned problem, and an object thereof is to provide a non-contact apparatus for measuring wafer thickness capable of accurately measuring the thickness of a wafer using laser light that repeatedly oscillates a linear sweep wavelength with high accuracy.

To attain the abovementioned object, the present invention includes the following configuration.

In other words, a non-contact apparatus for measuring wafer thickness according to the present invention includes: a monolithic wavelength sweeping semiconductor laser light source including a laser source, a laser control unit that controls the laser source, and a processor that is configured to cause the laser control unit to control the laser source so as to oscillate laser light having a wavelength that changes with a setting profile relative to time; an optical system that guides and emits the laser light onto a measurement portion of a wafer a thickness of which is desired to be obtained; a detection unit that detects an interference light signal of reflected light or transmitted light obtained from the measurement portion; an A/D converter that converts the interference light signal detected by the detection unit into a digital signal; and a calculation unit that calculates the thickness of the wafer by analyzing the digital signal from the A/D converter, in which the processor causes the laser control unit to operate with a clock signal generated by the processor, and to oscillate laser light that performs wavelength-sweeping with the setting profile relative to the time, from the laser source, and the A/D converter A/D converts the interference light signal by generating a sampling clock in synchronization with the clock signal generated by the processor or directly using the clock signal as a sampling clock.

The monolithic wavelength sweeping semiconductor laser light source includes no mechanical operation unit.

The frequency of the wavelength sweeping can be set to 1 to 40 kHz.

The range of the wavelength to be swept can be set to 1200 to 1400 nm.

The frequency of the clock signal can be set to 10 MHz to 1 GHz.

The interference light signal can be continuously detected while moving the wafer or the probe at a constant speed, and the thickness of the wafer can be measured.

The non-contact apparatus for measuring wafer thickness can be used as an apparatus for measuring wafer thickness when the wafer is polished by a double-sided polishing processing machine or a single-sided polishing processing machine.

As the monolithic wavelength sweeping laser light source, a light source equivalent to an SLE-101 made of Insight Photonic Solutions, Inc., US, can be used.

As the monolithic-type wavelength sweeping laser light source, a light source equivalent to an SLE-101 made of Insight Photonic Solutions, Inc., US, can be used.

A light source monitoring circuit using a reference wafer can be provided.

Alternatively, a light source monitoring circuit using an MZI interferometer can be provided.

The light source monitoring circuit can be configured to monitor a light amount of laser light released from the laser source, from a mean value of voltage output from the detection unit.

Alternatively, the light source monitoring circuit can be configured to monitor, for a frequency of an FFT peak value having an interference waveform acquired by the detection unit, a sweep wavelength accuracy that can be grasped from a mean value, a P-P value, or a deviation value, after the measurement has been performed a set number of times.

Advantageous Effects of Invention

The present invention exhibits the following advantageous functional effects.

In other words, according to the present invention: the monolithic wavelength sweeping semiconductor laser light source is used as a light source, whereby the sweep wavelength is repeated each time with high accuracy; and the processor generates a clock signal to obtain an interference signal by laser light that performs continuously and linearly wavelength-sweeping on the basis of the clock signal, and the interference light signal is A/D converted by generating a sampling clock in synchronization with the clock signal or directly using the clock signal as a sampling clock, whereby an interference effect of the laser light by the sweep wavelength and an analysis by high-speed Fourier transform of the interference light signal are performed in synchronization, and whereby a good thickness measurement of the wafer with a small accidental error can be performed.

BRIEF DESCRIPTION OF DRAWINGS

FIG. 6 is a block diagram of a system including a conventional mechanical operation.

DESCRIPTION OF EMBODIMENTS

Hereinafter, detailed descriptions of a preferred embodiment of the present invention will be given by use of the attached drawings.

Figure 1:
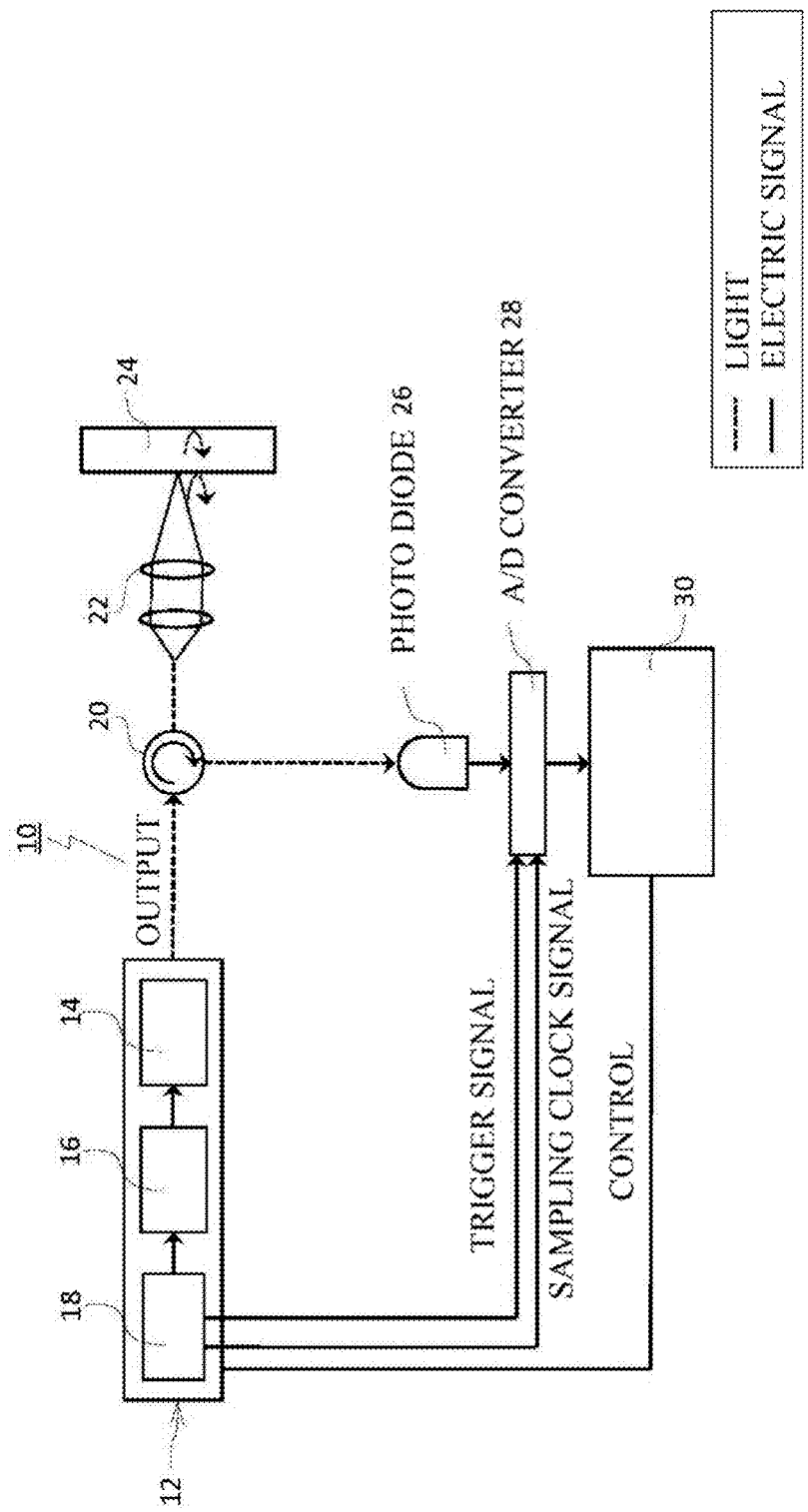
FIG. 1 is a block diagram illustrating an overall system of a non-contact apparatus for measuring wafer thickness according to an embodiment.

FIG. 1 is a block diagram illustrating an overall system of a non-contact apparatus 10 for measuring wafer thickness in the present embodiment.

The non-contact apparatus for measuring wafer thickness 10 includes a monolithic wavelength sweeping semiconductor laser light source (hereinafter, simply referred to as a laser light source, in some cases) 12.

The monolithic wavelength sweeping semiconductor laser light source 12 includes a semiconductor laser (laser source) 14 with a wavelength sweeping function, a laser control unit 16 that controls the laser source 14, and a processor 18 that controls the overall non-contact apparatus for measuring wafer thickness 10.

The laser light source 12 is configured as a so-called monolithic wavelength sweeping semiconductor laser light source that includes no mechanical operation unit such as a polygon mirror, and is configured such that the processor 18 causes the laser control unit 16 to control the laser source 14 so as to oscillate laser light of a wavelength that changes with a setting profile relative to time. As such the monolithic wavelength sweeping semiconductor laser light source 12, an SLE-101 light source made of Insight Photonic Solutions, Inc., US, can be used.

Specifically, a current value to be supplied to the wavelength variable semiconductor laser (laser source) 14 is changed (tuned) to control the wavelength of the laser light that is oscillated from the laser source 14 so as to change to a prescribed setting profile (suitably linear). This series of control is indicated in, for example, JP-T-2014-522105 (the term "JP-T" as used herein means a published Japanese translation of a PCT patent application).

More specifically, a current is applied to the laser source 14 while tuning the current to be supplied, laser light to be oscillated is detected by a detector, which is not illustrated, and is fed back to the processor 18 to readjust a current value to be supplied to the laser source 14, whereby feedback control is performed such that the wavelength of the laser light continuously changes, for example, linearly. This series of feedback control is indicated in, for example, JP-T-2014-522105.

Note that, the processor 18 generates, for example, a clock signal of 400 MHz (interval at 2.5 nsec), causes the laser control unit 16 to operate by the clock signal generated by the processor 18 to tune the current value, and thus causes the laser source 14 to oscillate laser light of the wavelength that changes with a setting profile relative to time.

With the abovementioned configuration, laser light of the wavelength that changes with a continuous and required profile (suitably, linearly) is emitted from the laser source 14.

The laser light released from the laser source 14 is projected onto a site to be measured of a wafer 24, from a circulator 20 and a probe 22. The circulator 20, the probe 22, and the like configure an optical system.

The laser light (interference light) reflected on front and rear surfaces of the wafer 24 is detected by a photo diode (detection unit) 26 via the probe 22 and the circulator 20, and is converted into an electric signal (interference light signal) by the photo diode 26, and the electric signal is amplified by an amplifier.

The laser light reflected on the front surface of the wafer 24 and the laser light reflected on the rear surface thereof interfere with each other, and are observed as interference light having a required phase.

Figure 2A:
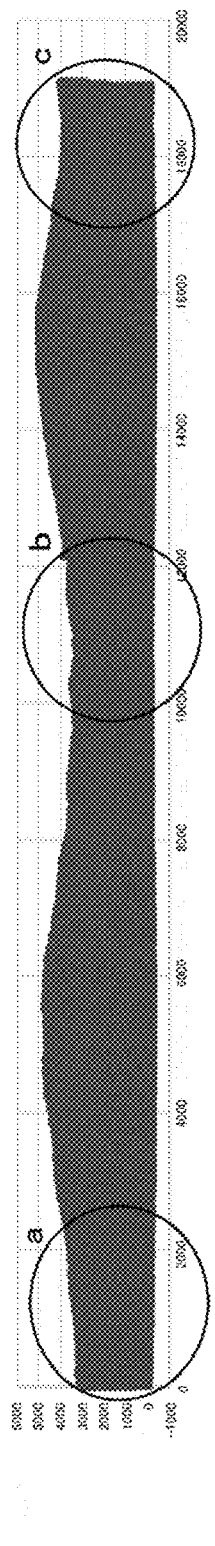
FIGS. 2A to 2D illustrate examples in which interference waveforms are overlapped in a case where the same location in a wafer is measured 10 times.
Figure 2B:
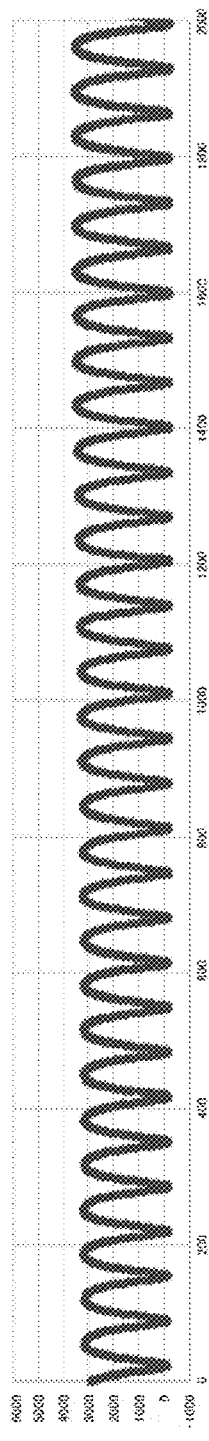
Figure 2C:
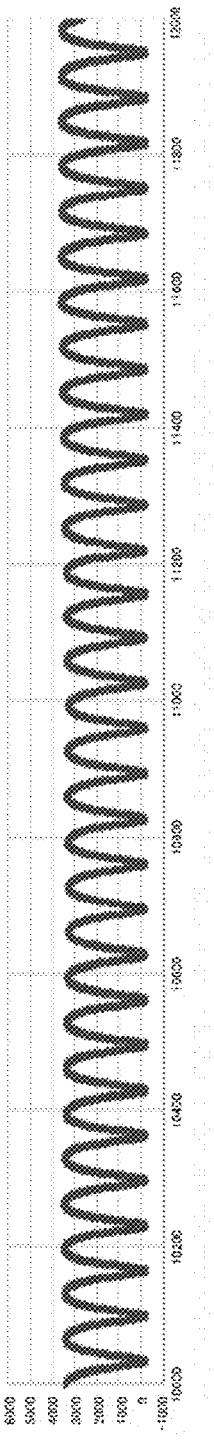
Figure 2D:
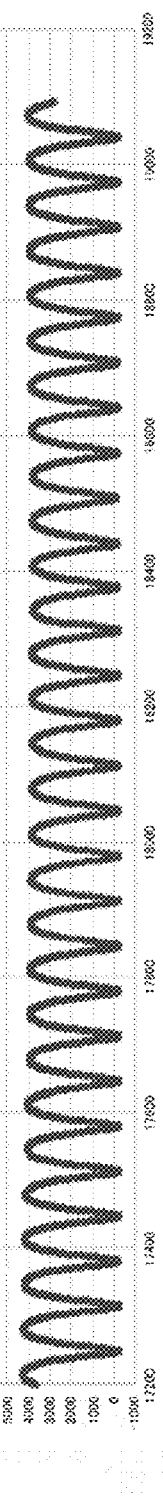

FIG. 2A illustrates an overlapped interference waveform in which the same location of the wafer 24 is measured 10 times. FIG. 2B illustrates an enlargement waveform of a site of a in FIG. 2A, FIG. 2C illustrates an enlargement waveform of a site of b in FIG. 2A, and FIG. 2D illustrates an enlargement waveform of a site of c in FIG. 2A.

As apparent from FIGS. 2A to 2D, the overlapped interference waveforms in which the same location of the wafer 24 is measured 10 times are in approximate agreement with one another from the beginning to the end. In this manner, it can be considered that the interference waveforms are in approximate agreement with one another, because the use of the monolithic wavelength sweeping semiconductor laser light source as a light source enables the emission wavelength of the laser light to be stably vary continuously and linearly.

The interference light signal is converted into a digital signal by the A/D converter 28, and is input into a computer (calculation unit) 30.

The A/D converter 28 receives input of an external trigger signal and the clock signal (clock signal to cause the laser control unit 16 to operate), which are generated by the processor 18, and generates a sampling clock in synchronization with the clock signal or directly uses the clock signal as a sampling clock to A/D convert an interference light (electric) signal.

Note that, laser light passing through the wafer 24, and interference light of the laser light that is reflected on the rear surface of the wafer 24 and is further reflected on the front surface and passed therethrough to the rear surface side may be observed.

In the computer 30, the thickness of the site to be measured in the wafer 24 is calculated from an interference (electric) signal to be input by a publicly known step.

As the publicly known step, for example, as indicated in the above-mentioned PTL 1 (JP-A-7-306018), the thickness of the wafer 24 can be measured by detecting a phase change $\Phi$ of the interference (electric) signal from a relational expression (including the refractive index of the wafer) of the interference.

Moreover, as indicated in PTL 1, without directly obtaining the phase change $\Phi$, the thickness of the wafer can be obtained by a frequency analysis. In other words, when the wavelength of the wavelength variable laser is changed by a constant amount $\Delta\lambda$, the interference light signal with the wavelength as a horizontal axis indicates a waveform in which a minute frequency modulation is applied to the center frequency. From a relational expression of the center frequency and the refractive index, the thickness of the wafer can be measured.

Alternatively, the center frequency is calculated by subjecting the abovementioned interference light signal to the signal processing by high-speed Fourier transform, and is converted with a calibration curve and a wafer refractive index acquired in advance, whereby the thickness of the wafer 24 can be measured.

Table 1 illustrates data in which the thickness of the site to be measured in the wafer 24 was measured by subjecting the interference light signal in a case where the same location in the wafer 24 was measured 10 times to the signal processing by high-speed Fourier transform.

As illustrated in Table 1, in a wafer having a thickness of approximately 722 μm, in the thickness measurement of subjecting an interference waveform in which the same position was acquired 10 times to the signal processing by high-speed Fourier transform, a good measurement with a small fluctuation in which the standard deviation was 2.99 nm was able to be performed. In a wafer having a thickness of approximately 776 μm, in the thickness measurement of subjecting an interference waveform in which the same position was acquired 10 times to the signal processing by high-speed Fourier transform, a good measurement with a small fluctuation in which the standard deviation was 3.03 nm was able to be performed.

In contrast, as illustrated in Table 1, in a case where a conventional mechanically driven light source is used, in the wafer having a thickness of approximately 722 μm, in the thickness measurement result obtaining by subjecting an interference waveform in which the same position was acquired 10 times to the signal processing by high-speed Fourier transform, the large fluctuation in which the standard deviation was 65.92 nm was obtained. Moreover, in the wafer having a thickness of approximately 776 μm, in the thickness measurement result obtaining by subjecting an interference waveform in which the same position was acquired 10 times to the signal processing by high-speed Fourier transform, the large fluctuation in which the standard deviation was 96.35 nm was obtained.

Figure 3A:
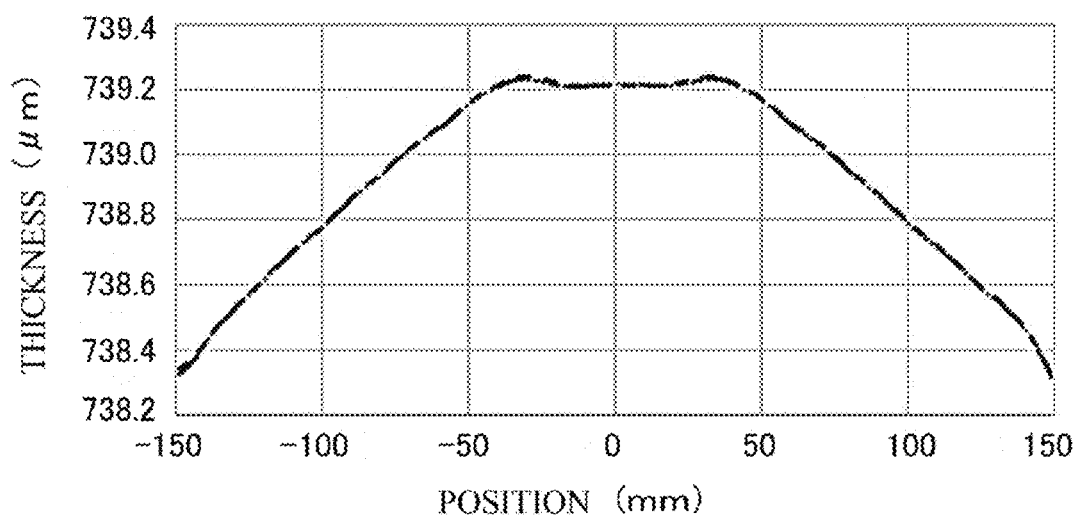
FIGS. 3A and 3B are graphs in which results obtained by repeatedly measuring the thickness of the wafer three times in a radial direction are drawn in an overlapped manner (FIG. 3A).

FIG. 3A is a graph in which results obtained by repeatedly measuring the thickness of a wafer of $\Phi$ 300 mm three times in a radial direction using the monolithic wavelength sweeping semiconductor laser light source illustrated in FIG. 1 (SLE-101 light source made of Insight Photonic Solutions, Inc., U.S.) are drawn in an overlapped manner. The wafer was caused to move at a speed of 5 mm/sec, and the thickness thereof was measured over the entire radial direction. As illustrated in FIG. 3, graphs of results of the measurement three times are entirely overlapped to one another without being shifted. This indicates that the repetition wavelength sweeping accuracy of the light source is extremely high.

Figure 3B:
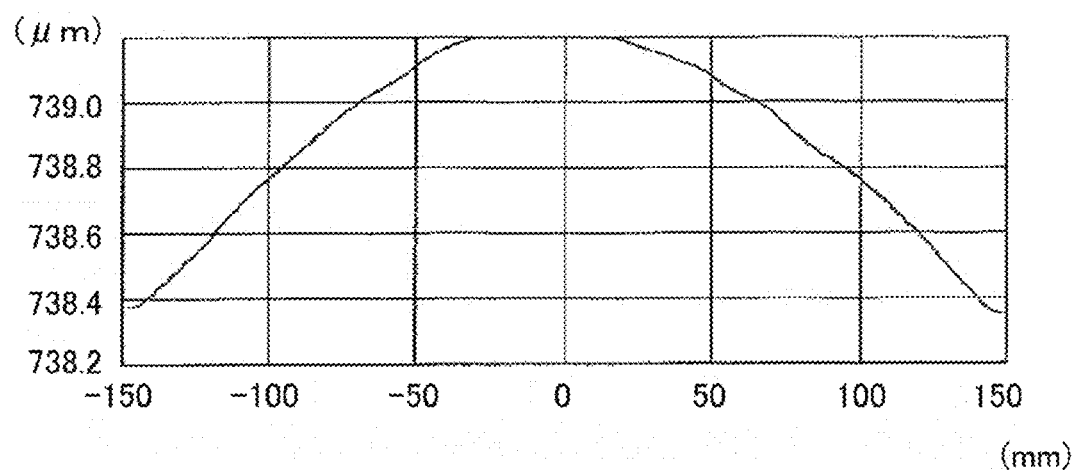

Note that, FIG. 3B is a graph indicating results obtained by measuring the thickness of a wafer of $\Phi$ 300 mm using a thickness measurement apparatus: KURODA NANO-METRO (registered trademark) 300TT-M made of KURODA Precision Industries Ltd., which is currently used by the applicant, and in the results of the measurement by both of the apparatuses illustrated in FIGS. 3A and 3B, convex shapes of the wafer are in good agreement with each other.

The reason why such the good thickness measurement was able to be performed is because the use of the monolithic wavelength sweeping semiconductor laser light source as a light source stabilizes the sweep wavelength each time. Moreover, it can be considered that the processor 18 generates a clock signal to obtain an interference light signal by laser light the wavelength of which was continuously and linearly changed on the basis of the clock signal, and the interference light signal is A/D converted by generating a sampling clock in synchronization with the clock signal or directly using the clock signal as a sampling clock, whereby an interference effect of the laser light by the sweep wavelength and an analysis by the signal processing by highspeed Fourier transform of the interference light signal are performed in synchronization to cause no shift.

When the thickness of the wafer 24 is measured, an interference light signal can be continuously detected while moving the wafer 24 or the probe 22 at a constant speed, and the thickness of the wafer 24 can be measured.

When the wafer 24 is polished by a double-sided polishing processing machine or a single-sided polishing processing machine (not illustrated), the thickness of the wafer 24 can be measured continuously or at regular time intervals using the apparatus 10 for measuring wafer thickness during the polishing processing.

Note that, the frequency of the wavelength sweeping of the laser light can be set to 1 to 40 kHz.

The range of the wavelength of the laser light can be set to 1200 to 1400 nm at which the laser light passes through the silicon wafer.

The speed of the sampling clock is varied in wavelength at 10 MHz to 1 GHz, whereby an interference waveform can be measured.

Moreover, the interference waveform can be continuously measured while moving the wafer 24 or the probe 22 at a constant speed, and the thickness of a wafer can be measured.

Moreover, the polishing rate of the wafer is preferably measured by a double-sided polishing machine or a single-sided polishing machine of the wafer.

Moreover, in order to accurately obtain a wavelength changing amount or an absolute value of the wavelength, the laser light source 12 with high accuracy needs to be used, which increases the cost.

Therefore, as indicated in PTL 1 (JP-A-7-306018), it is also possible to provide a reference optical system, and calculate the thickness of a measurement sample by calculation, using a reference sample having the same composition as the measurement sample and the accurately known thickness, from a relational expression among the frequency of an interference light signal output from the optical system of the measurement sample, the frequency of an interference light signal output from the optical system of the reference sample, the thickness of the reference sample, and the thickness to be obtained of the measurement sample.

Figure 4:
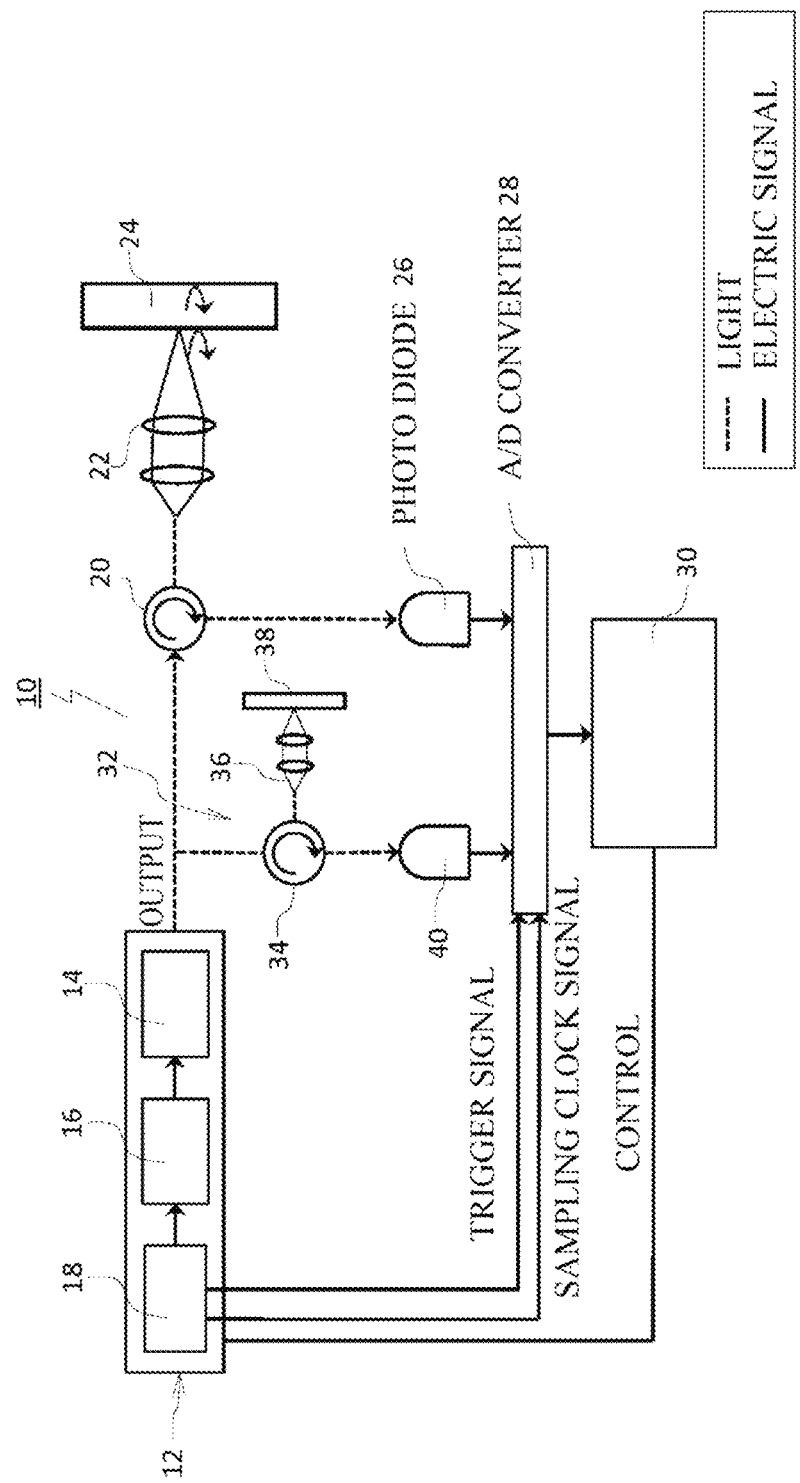
FIG. 4 is a block diagram illustrating an overall system of a non-contact apparatus for measuring wafer thickness in which a light source monitoring circuit using a reference wafer is provided.

FIG. 4 is a block diagram of an overall system illustrating another embodiment of the monolithic wavelength sweeping semiconductor laser light source 10.

The same members as those illustrated in FIG. 1 are indicated by the same reference numerals, and explanations thereof are omitted.

In the present embodiment, a light source monitoring circuit 32 by a reference wafer is added.

The light source monitoring circuit 32 is configured such that laser light released from the laser source 14 and split emits onto a reference wafer 38 from a circulator 34 and a probe 36. The laser light (interference light) reflected on front and rear surfaces of the reference wafer 38 is detected by a photo diode 40 through the probe 36 and the circulator 34, and is converted into a digital signal by the A/D converter 28, and the digital signal is input into the computer 30.

The computer 30 calculates a mean value of a voltage (mean value within a set time) to be output from the photo diode 40, from the input digital signal value. The voltage value to be output from the photo diode 40 varies in proportion to the increase or decrease in the light amount of laser light released from the laser source 14. The variation of the abovementioned voltage value is monitored as appropriate, and when the abovementioned mean value of the voltage is lowered to a value lower than a threshold set in advance, abnormality is determined, and a warning is issued.

Alternatively, the light source monitoring circuit 32 can be also used for monitoring the sweep wavelength accuracy of the monolithic wavelength sweeping semiconductor laser light source 12. The thickness (and distribution thereof) of the reference wafer 38 is constant, so that in a case where a shift occurs in the measured thickness, it can be determined that the sweep wavelength accuracy of the monolithic wavelength sweeping semiconductor laser light source 12 has been varied, which can serve as a measure for grasping a variation factor thereof. The sweep wavelength accuracy can be grasped, for the frequency of the FFT peak value of the acquired interference waveform, from a mean value, a P-P value, a deviation value, and the like measured at the set number of times (for example, 1000 times).

Note that, the timing of monitoring can be set by a program. For example, the timing can be immediately prior to the wafer thickness measurement.

Figure 5:
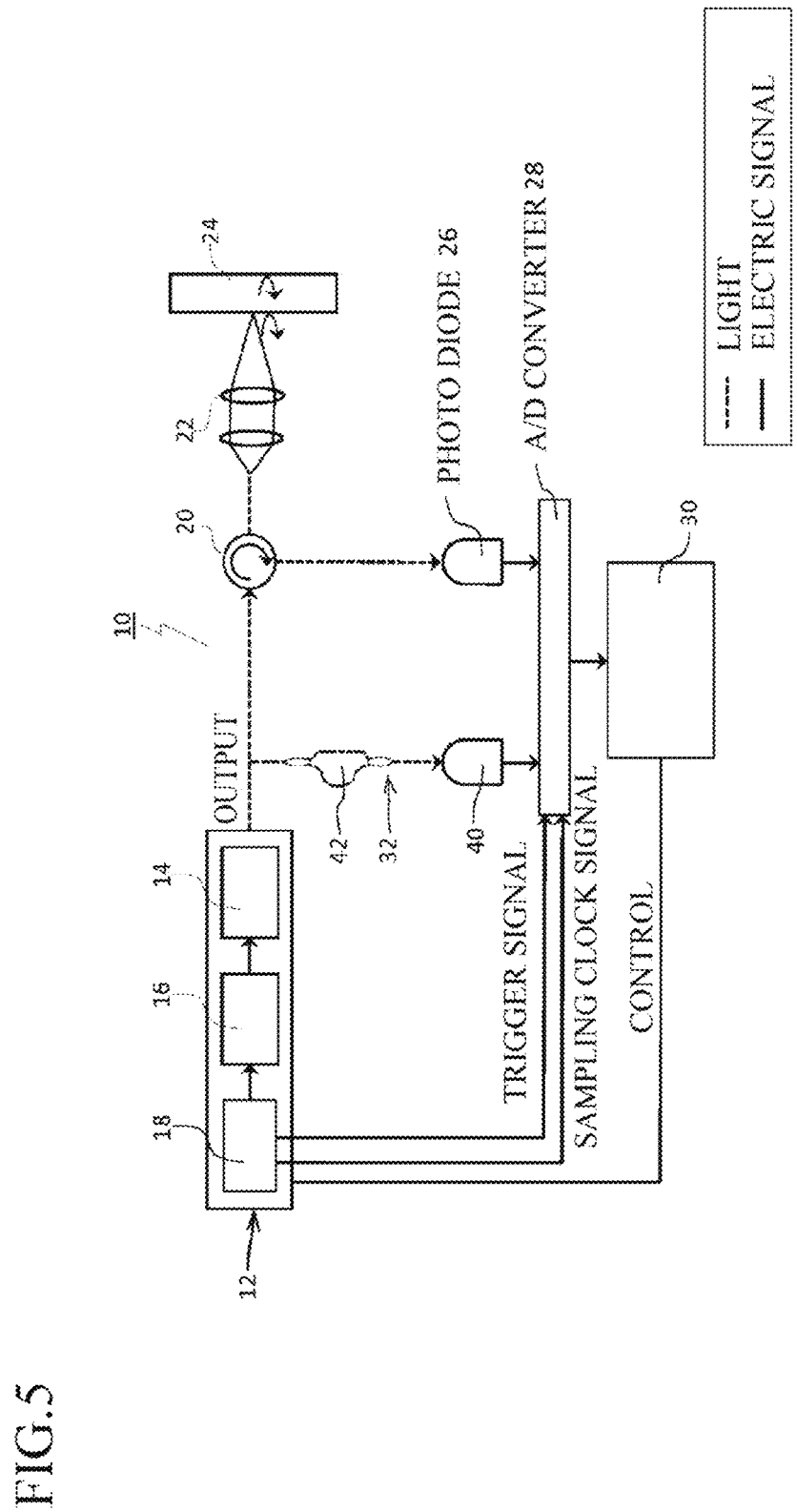
FIG. 5 is a block diagram illustrating an overall system of a non-contact apparatus for measuring wafer thickness in which a light source monitoring circuit using an MZI interferometer is provided.

FIG. 5 is a block diagram illustrating still another embodiment of the non-contact apparatus for measuring wafer thickness 10. The present embodiment is the same as the other embodiments except that an MZI (Mach-Zehnder) interferometer 42 is used as a light source monitoring circuit.

In the present embodiment as well, similar to the above, the sweep wavelength accuracy of the monolithic wavelength sweeping semiconductor laser light source 12 can be grasped, and the present embodiment can be used for monitoring the light source.

Note that. The use of the fiber MZI interferometer has such a merit that the refractive index of quartz glass as a fiber material is about 1.4, which is lower than approximately 3.5 of the refractive index of silicon wafer, and results in small change in the length of an optical path due to an influence of the temperature.

TABLE 1

Comparison in accuracy of wafer thickness measurement between conventional light source and Insight light source
Measurement conditions
(1) same location was measured 10 times for each of 8 inch and 12 inch wafers
(2) refractive index of water was constant

| Conventional mechanically driven light source | | | | | | | |
|---|---|---|---|---|---|---|---|
| | Thickness μm | Measurement #1 nm | Measurement #2 nm | Measurement #3 nm | Measurement #4 nm | Measurement #5 nm | Measurement #6 nm |
| 8 inch wafer | 722 | 721896.1 | 722022.3 | 723022. | 722077.8 | 722019.4 | 721944.1 |
| 12 inch wafer | 766 | 775959.2 | 776056.6 | 776056.6 | 776018.5 | 776222.5 | 776015.8 |

| Conventional mechanically driven light source | | | | | | |
|---|---|---|---|---|---|---|
| | Measurement #7 nm | Measurement #8 nm | Measurement #9 nm | Measurement #10 nm | Measurement P-P nm | Standard deviation nm |
| 8 inch wafer | 721998.7 | 722090.6 | 722043.7 | 721889.7 | 200.95 | 65.92 |
| 12 inch wafer | 776001.8 | 775817.6 | 775935.9 | 775977.7 | 404.83 | 96.35 |

TABLE 1-continued

Comparison in accuracy of wafer thickness measurement between conventional light source and Insight light source
Measurement conditions
(1) same location was measured 10 times for each of 8 inch and 12 inch wafers
(2) refractive index of water was constant

| | | | | Insight light source | | | |
|---|---|---|---|---|---|---|---|
| | Thickness μm | Measurement #1 nm | Measurement #2 nm | Measurement #3 nm | Measurement #4 nm | Measurement #5 nm | Measurement #6 nm |
| 8 inch wafer | 722 | 722000.7 | 721997.4 | 721999.8 | 721999.1 | 722006.4 | 721999.0 |
| 12 inch wafer | 766 | 775999.3 | 776004.0 | 776002.1 | 775994.0 | 775997.5 | 775997.6 |

| | | | Insight light source | | | |
|---|---|---|---|---|---|---|
| | Measurement #7 nm | Measurement #8 nm | Measurement #9 nm | Measurement #10 nm | Measurement P-P nm | Standard deviation nm |
| 8 inch wafer | 722002.1 | 722002.4 | 721995.0 | 721998.1 | 11.44 | 2.99 |
| 12 inch wafer | 776003.0 | 775998.4 | 776000.8 | 776003.3 | 9.98 | 3.03 |

What is claimed is:

1. A non-contact apparatus for measuring wafer thickness, comprising:
a monolithic wavelength sweeping semiconductor laser light source including a laser source, a laser control unit that controls the laser source, and a processor that is configured to cause the laser control unit to control the laser source so as to oscillate laser light having a wavelength that changes with a setting profile relative to time;
an optical system that guides and emits the laser light onto a measurement portion on one surface of a wafer a thickness of which is desired to be obtained;
a detection unit that detects an interference light signal of laser light reflected from the one surface of the wafer and laser light passed through the wafer and reflected from another surface thereof, obtained from the measurement portion;
an A/D converter that converts the interference light signal detected by the detection unit into a digital signal; and
a calculation unit that calculates the thickness of the wafer by analyzing the digital signal from the A/D converter, wherein
the processor causes the laser control unit to operate with a clock signal generated by the processor, and to oscillate laser light that performs wavelength-sweeping with the setting profile relative to the time, from the laser source,
the A/D converter A/D converts the interference light signal by generating a sampling clock in synchronization with the clock signal generated by the processor or directly using the clock signal as a sampling clock, and
a light source monitoring circuit using a reference wafer, wherein the light source monitoring circuit monitors, for a frequency of a Fast-Fourier Transform (FFT) peak value having an interference waveform acquired by the detection unit for the reference wafer, a sweep wavelength accuracy that can be grasped from a mean value, a Peak to Peak (P-P) value, or a deviation value, after the measurement has been performed a set number of times.

2. The non-contact apparatus for measuring wafer thickness according to claim 1, wherein the monolithic-type wavelength sweeping semiconductor laser light source includes no mechanical operation unit.

3. The non-contact apparatus for measuring wafer thickness according to claim 1, wherein a frequency of the wavelength sweeping is 1 to 40 KHz.

4. The non-contact apparatus for measuring wafer thickness according to claim 1, wherein a range of the wavelength to be swept is 1200 to 1400 nm.

5. The non-contact apparatus for measuring wafer thickness according to claim 1, wherein a frequency of the clock signal is 10 MHz to 1 GHz.

6. The non-contact apparatus for measuring wafer thickness according to claim 1, wherein while moving the wafer or a probe at a constant speed, the interference light signal is continuously detected to measure a thickness of the wafer.

7. The non-contact apparatus for measuring wafer thickness according to claim 1, wherein the non-contact-type apparatus for measuring wafer thickness is an apparatus for measuring wafer thickness when the wafer is polished by a double-sided polishing processing machine or a single-sided polishing processing machine.

8. The non-contact apparatus for measuring wafer thickness according to claim 1, further comprising a light source monitoring circuit using a Mach-Zehnder interferometer (MZI) interferometer.

9. The non-contact apparatus for measuring wafer thickness according to claim 1, wherein the light source monitoring circuit monitors a light amount of laser light released from the laser source, from a mean value of a voltage output from the detection unit.

* * * * *